United States Patent
Song et al.

(10) Patent No.: US 12,034,036 B2
(45) Date of Patent: Jul. 9, 2024

(54) SEMICONDUCTOR DEVICE AND SEMICONDUCTOR APPARATUS INCLUDING THE SAME

(71) Applicant: Samsung Electronics Co., Ltd., Suwon (KR)

(72) Inventors: Jeonggyu Song, Seongnam-si (KR); Younsoo Kim, Yongin-si (KR); Haeryong Kim, Seongnam-si (KR); Boeun Park, Hwaseong-si (KR); Eunha Lee, Seoul (KR); Jooho Lee, Hwaseong-si (KR); Hyangsook Lee, Suwon-si (KR); Yong-Hee Cho, Suwon-si (KR); Eunae Cho, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 230 days.

(21) Appl. No.: 17/334,030

(22) Filed: May 28, 2021

(65) Prior Publication Data

US 2022/0140067 A1    May 5, 2022

(30) Foreign Application Priority Data

Nov. 3, 2020  (KR) .......................... 10-2020-0145525
Jan. 5, 2021  (KR) .......................... 10-2021-0001061

(51) Int. Cl.
*H01L 29/08*  (2006.01)
*H01L 49/02*  (2006.01)

(52) U.S. Cl.
CPC ............. *H01L 28/65* (2013.01); *H01L 28/56* (2013.01); *H01L 29/0847* (2013.01)

(58) Field of Classification Search
None
See application file for complete search history.

(56) References Cited

U.S. PATENT DOCUMENTS

| | | | |
|---|---|---|---|
| 7,508,649 B2 * | 3/2009 | Kwon | ...................... H01G 4/10 361/313 |
| 8,278,735 B2 | 10/2012 | Hashim et al. | |
| 8,574,998 B2 * | 11/2013 | Malhotra | ................ H01L 28/40 257/E21.011 |
| 2002/0000598 A1 | 1/2002 | Kang et al. | |
| 2003/0184952 A1 | 10/2003 | Baniecki et al. | |
| 2004/0033698 A1 | 2/2004 | Lee et al. | |

(Continued)

FOREIGN PATENT DOCUMENTS

KR        10-0703966 B1      4/2007
KR     10-2007-0106289 A    11/2007

(Continued)

OTHER PUBLICATIONS

Extended European Search Report issued Jan. 5, 2022 in European Application No. 21178457.4.

*Primary Examiner* — Cory W Eskridge
(74) *Attorney, Agent, or Firm* — Harness, Dickey & Pierce, P.L.C.

(57) ABSTRACT

A semiconductor device includes a lower electrode; an upper electrode disposed to be spaced apart from the lower electrode; and a dielectric layer disposed between the lower electrode and the upper electrode, and including a first metal oxide region, a second metal oxide region, and a third metal oxide region.

26 Claims, 12 Drawing Sheets

(56) References Cited

U.S. PATENT DOCUMENTS

| | | | |
|---|---|---|---|
| 2006/0158829 A1* | 7/2006 | Kwon | H01G 4/10 361/313 |
| 2007/0097596 A1 | 5/2007 | Kuwajima et al. | |
| 2007/0134931 A1* | 6/2007 | Ahn | H01L 21/02194 438/758 |
| 2010/0172065 A1* | 7/2010 | Huang | H01G 4/10 361/313 |
| 2012/0061799 A1* | 3/2012 | Hashim | C23C 14/083 257/532 |
| 2013/0122683 A1 | 5/2013 | Malhotra et al. | |
| 2013/0143379 A1 | 6/2013 | Malholtra et al. | |
| 2014/0187015 A1 | 7/2014 | Rui et al. | |
| 2016/0133691 A1* | 5/2016 | Phatak | H01L 28/75 257/532 |
| 2020/0058731 A1 | 2/2020 | Mun et al. | |
| 2020/0105438 A1 | 4/2020 | Takahashi et al. | |
| 2020/0312553 A1 | 10/2020 | Ootsuki et al. | |
| 2022/0093603 A1* | 3/2022 | Cho | H01L 28/55 |

FOREIGN PATENT DOCUMENTS

| | | |
|---|---|---|
| KR | 10-0780650 B1 | 11/2007 |
| KR | 2020-0019553 A | 2/2020 |

\* cited by examiner

SEMICONDUCTOR DEVICE AND SEMICONDUCTOR APPARATUS INCLUDING THE SAME

CROSS-REFERENCE TO RELATED APPLICATIONS

This application is based on and claims priority under 35 U.S.C. § 119 to Korean Patent Application Nos. 10-2020-0145525 and 10-2021-0001061, filed on Nov. 3, 2020, and Jan. 5, 2021, in the Korean Intellectual Property Office, the disclosures of which are incorporated by reference herein in their entireties.

BACKGROUND

1. Field

The present disclosure relates to a semiconductor device and a semiconductor apparatus including the same.

2. Description of the Related Art

As electronic apparatuses are being downscaled, the space occupied by semiconductor devices in electronic apparatuses is also being reduced. Accordingly, a reduction in the size of a semiconductor device, such as a capacitor, and/or a reduction in the thickness of a dielectric layer of the semiconductor device are also required at the same time. However, in this case, a large current leakage may occur through the dielectric layer of the semiconductor device, which may make it difficult to drive the device.

SUMMARY

Provided are electronic devices having a high capacitance and a low leakage current value, and a semiconductor apparatus including the same.

Provided is an electronic device including a dielectric layer including three or more metal oxide layers.

Additional aspects will be set forth in part in the description, which follows and, in part, will be apparent from the description, or may be learned by practice of the presented embodiments of the disclosure.

According to an aspect of the present disclosure, a semiconductor device includes a lower electrode; an upper electrode spaced apart from the lower electrode; and a dielectric layer between the lower electrode and the upper electrode. The dielectric layer including a first metal oxide region, a second metal oxide region, and a third metal oxide region.

The first metal oxide region may include one or more of Hf, Zr, Nb, Ta, Pr, Nd, Gd, Dy, Yb, Pb, Zn, Si, Ti, Sr, or Lu, The second metal oxide region may include one or more of Y, Sc, or Ce, and The third metal oxide region may include one or more of Al, Mg, or Be.

The first metal oxide region may include a first metal oxide layer; the second metal oxide region may include a second metal oxide layer; and the third metal oxide region may include a third metal oxide layer. The first metal oxide layer, the second metal oxide layer, and the third metal oxide layer may be, sequentially, in a stack between a lower electrode and an upper electrode in a thickness direction.

The second metal oxide region may further include one or more of Hf, Zr, Nb, Ta, Pr, Nd, Gd, Dy, Yb, Pb, Zn, Si, Ti, Sr, or Lu.

The second metal oxide region may include a compound expressed as $A_xB_yO_z$, where A is one or more of Y, Sc, or Ce, B is one or more of Hf, Zr, Nb, Ta, Pr, Nd, Gd, Dy, Yb, Pb, Zn, Si, Ti, Sr, or Lu, O is oxygen, and $x+y+z=1$.

In the second metal oxide region, a ratio of A to B may be greater than or equal to 0.01 and less than or equal to 1.0.

x may be greater than 0.0 and less than or equal to 0.2. x may be greater than 0.0 and less than or equal to 0.15.

y may be greater than 0.0 and less than or equal to 0.5.

The first metal oxide region may be adjacent to the lower electrode, and a thickness of the first metal oxide region may be greater than or equal to 40% of a total thickness of the dielectric layer.

A thickness of the second metal oxide region may be greater than or equal to 5 Å and less than or equal to 50 Å.

A thickness of the dielectric layer may be greater than or equal to 20 Å and less than or equal to 100 Å.

At least one of the lower electrode or the upper electrode may include a metal, a metal nitride, a metal oxide, or a combination thereof.

At least one of the lower electrode or the upper electrode both may include a metal nitride expressed as MM'N, where M is one or more of Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, or U, M' is different from M and is one or more of H, Li, As, Se, N, O, P, S, Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, or U, and N is nitrogen.

According to another aspect of the present disclosure, an electronic device includes a lower electrode; an upper electrode spaced apart from the lower electrode; and a dielectric layer between the lower electrode and the upper electrode. The dielectric layer may include a metal oxide region including a compound expressed as $A_xB_yO_z$ where A is one or more of Y, Sc, and Ce, B is one or more of Hf, Zr, Nb, Ta, Pr, Nd, Gd, Dy, Yb, Pb, Zn, Si, Ti, Sr, and Lu, $x+y+z=1$, and $0<x\le0.2$, $0<y\le0.5$).

A thickness of the dielectric layer may be greater than or equal to 10 Å and less than or equal to 50 Å.

x may be greater than 0.0 and less than or equal to 0.15.

y may be greater than or equal to 0.2 and less than or equal to 0.5.

According to another aspect of the present disclosure, a semiconductor device includes a lower electrode; an upper electrode spaced apart from the lower electrode; and a dielectric layer between the lower electrode and the upper electrode. The dielectric may include one or more first elements selected from Hf, Zr, Nb, Ta, Pr, Nd, Gd, Dy, Yb, Pb, Zn, Si, Ti, and Lu, one or more second elements selected from Y, Sc, and Ce, and one or more third elements selected from Al, Mg, and Be, and the second element and the third element may have a concentration gradient in a thickness direction of a dielectric layer, and each has a maximum concentration at different positions in the dielectric.

The second metal element may have a maximum concentration at a position greater than or equal to 40% and less than or equal to 90% of a thickness of the dielectric layer away from the lower electrode.

A ratio of a content of the second metal element to a total metal element in the dielectric layer may be greater than 0.0 at % and less than or equal to 5.0 at %.

The third metal element may have a maximum concentration at a position greater than 0% and less than or equal to 20% of a thickness of the dielectric layer away from the upper electrode.

A ratio of a content of the third metal element to a total metal element in the dielectric layer may be greater than 0.0 at % and less than or equal to 5.0 at %.

In the dielectric layer, ratio of a content of the second metal element to a content of to the third metal element may be greater than or equal to 10% and less than or equal to 200%.

According to another aspect of the present disclosure, a semiconductor apparatus includes a field effect transistor and the electronic device described above electrically connected to the field effect transistor.

The field effect transistor may include a semiconductor layer including a source and a drain; a gate insulating layer on the semiconductor layer; and a gate electrode on the gate insulating layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
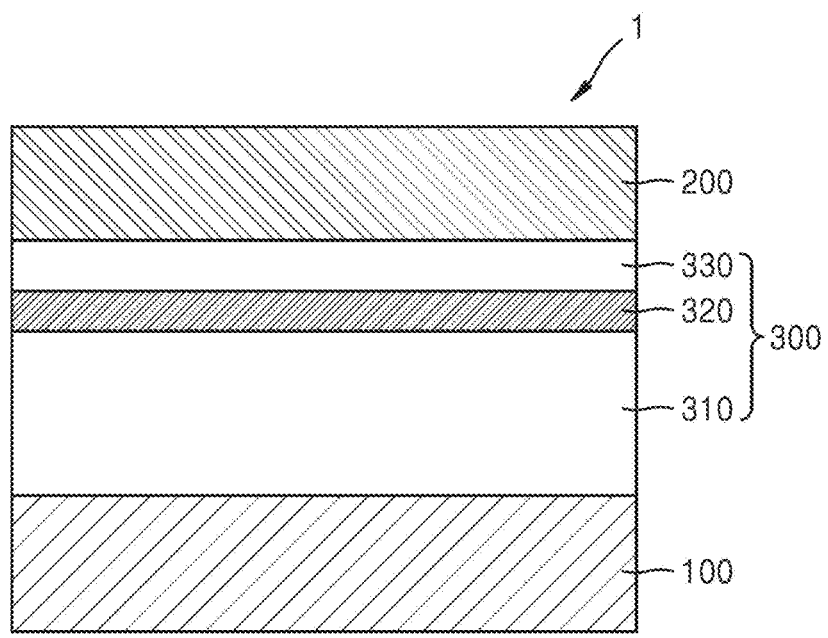
FIGS. 1 to 3B are schematic diagrams of capacitors according to some embodiments.

Reference will now be made in detail to some example embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

In the following description, terms are used only for explaining specific embodiments while not limiting the scope of the present disclosure. When an element is referred to as being "above" or "on" another element, the element may be directly on an upper, lower, left, or right side of the other element while making contact with the other element or may be above an upper, lower, left, or right side of the other element without making contact with the other element.

The terms of a singular form may include plural forms unless otherwise mentioned. Unless otherwise mentioned, the terms "comprises" and/or "comprising" used herein specify the presence of stated features, numbers, steps, processes, elements, components, materials, or combinations thereof but do not preclude the presence or addition of one or more other features, numbers, steps, processes, elements, components, materials, or combinations thereof.

Although terms such as "first," "second," and "third" are used to describe various elements, the terms are only used to distinguish one element from other elements, and the features of the elements such as order and type should not be limited by the terms. In addition, terms such as "unit," "means," "module," or "part" may be used to denote a unit of a comprehensive structure that has at least one function or operation, and may be implemented with hardware, software, or a combination of hardware and software.

Hereinafter, embodiments will be described with reference to the accompanying drawings. In the drawings, like reference numerals refer to like elements, and the sizes of elements (such as the widths and thicknesses of layers or regions) may be exaggerated for clarity of illustration. The embodiments described herein are for illustrative purposes only, and various modifications may be made therein.

According to an aspect, a semiconductor device having a small leakage current and a high capacitance may be provided. The semiconductor device may be a capacitor.

FIG. 1 is a schematic diagram of a capacitor 1 according to some embodiments. Referring to FIG. 1, the capacitor 1 may include a lower electrode 100, an upper electrode 200 spaced apart from the lower electrode 100, and a dielectric layer 300 disposed between the lower electrode 100 and the upper electrode 200.

In some embodiments, the lower electrode 100 may be disposed on a substrate (not shown). The substrate may be a part of a structure supporting the capacitor 1 and/or a part of a device connected to the capacitor 1. The substrate may include a semiconductor material pattern, an insulating material pattern, and/or a conductive material pattern. The substrate may include, for example, a substrate 11', a gate stack 12, an interlayer insulating layer 15, a contact structure 20', and/or a bit line structure 13 of FIGS. 5 and 6. In addition, the substrate may include, for example, a conductive material such as copper (Cu), silver (Ag), aluminum (Al), gold (Au), ruthenium (Ru), titanium (Ti), tantalum (Ta), niobium (Nb), iridium (Ir), molybdenum (Mo), tungsten (W), platinum (Pt), etc., a semiconductor material such as silicon (Si), germanium (Ge), silicon germanium (SiGe), silicon carbide (SiC), gallium arsenic (GaAs), indium arsenic (InAs), indium phosphide (InP), etc., and/or an insulating material such as silicon oxide, silicon nitride, and/or silicon oxynitride.

The upper electrode 200 may be disposed to be spaced apart from and to face the lower electrode 100. The lower electrode 100 and/or the upper electrode 200 may independently include a metal, a metal nitride, a metal oxide, or a combination thereof. For example, the lower electrode 100 and/or the upper electrode 200 may each include independently a metal such as copper (Cu), silver (Ag), aluminum (Al), gold (Au), ruthenium (Ru), titanium (Ti), tantalum (Ta), niobium (Nb), iridium (Ir), molybdenum (Mo), tungsten (W), platinum (Pt), etc., a conductive metal nitride such as titanium nitride (TiN), tantalum nitride (TaN), niobium nitride (NbN), molybdenum nitride (MoN), cobalt nitride (CoN), tungsten nitride (WN), etc., and/or a conductive metal oxidation such as platinum oxide (PtO), iridium oxide (IrO$_2$), ruthenium oxide (RuO$_2$), strontium ruthenium oxide (SrRuO$_3$), barium strontium ruthenium oxide ((Ba,Sr)RuO$_3$), calcium ruthenium oxide (CaRuO$_3$), lanthanum strontium cobalt oxide ((La,Sr)CoO$_3$), etc.

For example, the lower electrode 100 and/or the upper electrode 200 may independently include a metal nitride expressed as MM'N. M is a metal element, M' is an element different from M, and N is nitrogen. Such a metal nitride may include an MN metal nitride doped with the element M'. In some embodiments, M may be one or more elements selected from Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and/or U. In some embodiments, M' may be one or more elements selected from H, Li, As, Se, N, O, P, S, Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and/or U. When a composition ratio of M, M', and N in the metal nitride MM'N is represented by x:y:z, $0 \le x \le 2$, $0 \le y \le 2$, $0 \le z \le 4$, and one of x and y is not zero.

The lower electrode 100 and/or the upper electrode 200 may independently have a single material layer and/or a stack structure of a plurality of material layers. For example, in some embodiments, the lower electrode 100 and/or the upper electrode 200 may independently be a single layer of titanium nitride (TiN) or a single layer of niobium nitride (NbN). Alternatively, the lower electrode 100 and/or the upper electrode 200 may have a stack structure including a first electrode layer including a plurality of titanium nitride (TiN) layers and a second electrode layer including a plurality of niobium nitride (NbN) layers.

The dielectric layer 300 may include a first metal oxide layer 310, a second metal oxide layer 320, and a third metal oxide layer 330. The first metal oxide layer 310 may be disposed adjacent to the lower electrode 100, and the third metal oxide layer 330 may face and be spaced apart from the first metal oxide layer 310 and may be disposed adjacent to the upper electrode 200. The second metal oxide layer 320 may be disposed between the first metal oxide layer 310 and the third metal oxide layer 330. For example, the first metal oxide layer 310, the second metal oxide layer 320, and the third metal oxide layer 330 may be sequentially disposed in a thickness direction of the dielectric layer 300.

The first metal oxide layer 310 may have a high dielectric constant. For example, the first metal oxide layers 310 may independently have a dielectric constant greater than or equal to the dielectric constant of silicon dioxide. For example, in some embodiments, the first metal oxide layers 310 may independently have a dielectric constant equal to or more than 20 or more and equal to and/or less than 70. In some embodiments, the first metal oxide layer 310 may include one or more metals (and/or metalloids) selected from Hf, Zr, Nb, Ta, Pr, Nd, Gd, Dy, Yb, Pb, Zn, Si, Ti, Al, and/or Lu. For example, the first metal oxide layer 310 may include independently hafnium oxide (HfO$_2$), hafnium silicon oxide (HfSiO$_4$), zirconium oxide (ZrO$_2$), hafnium zirconium oxide (HfZrO$_2$), zirconium silicon oxide (ZrSiO$_4$), tantalum oxide (Ta$_2$O$_5$), titanium oxide (TiO$_2$), strontium titanium oxide (SrTiO$_3$), red zinc niobate (PbZnNbO$_3$), etc. In addition, the first metal oxide layer 310 may include a metal nitride oxide such as aluminum oxynitride (AlON), zirconium oxynitride (ZrON), hafnium oxynitride (HfON), etc., a silicate such as ZrSiON, HfSiON, etc., and/or an aluminate such as ZrAlON, HfAlON, etc.

The second metal oxide layer 320 may include one or more metal elements selected from Y, Sc, and Ce, and may further include one or more elements selected from Hf, Zr, Nb, Ta, Pr, Nd, Gd, Dy, Yb, Pb, Zn, Si, Ti, Al, and Lu. For example, the second metal oxide layer 320 may include a compound expressed as A$_x$B$_y$O$_z$ (A is one or more elements selected from Y, Sc, and/or Ce, B is one or more elements selected from Hf, Zr, Nb, Ta, Pr, Nd, Gd, Dy, Yb, Pb, Zn, Si, Ti, Sr, Al, and/or Lu, O is oxygen, and x+y+z=1). In some embodiments, a content x of the element A may be greater than 0.0, greater than or equal to 0.001, greater than or equal to 0.005, greater than or equal to 0.01, greater than or equal to 0.015, greater than or equal to 0.02, less than or equal to 0.2, less than or equal to 0.18, and/or less than or equal to 0.15. A content y of the B element may be greater than 0.0, greater than or equal to 0.05, greater than or equal to 0.10, greater than or equal to 0.15, greater than or equal to 0.18, greater than or equal to 0.20, greater than or equal to 0.22, less than or equal to 0.50, less than or equal to 0.45, less than or equal to 0.40, and/or less than or equal to 0.35. In addition, the content x of the element A may be greater than or equal to 0.01, greater than or equal to 0.02, greater than or equal to 0.05, greater than or equal to 0.07, greater than or equal to 0.10, less than or equal to 1.0, less than or equal to 0.9, less than or equal to 0.8, or less than or equal to 0.7 compared to the content y of the B element.

The third metal oxide layer 330 may include one or more of Al, Mg, and Be.

As a result, the dielectric layer 300 includes three or more metal elements. for example, the dielectric layer 300 may include one or more metal elements (and/or metalloids) selected from Hf, Zr, Nb, Ta, Pr, Nd, Gd, Dy, Yb, Pb, Zn, Si, Ti, and/or Lu, may include one or more metal elements selected from Y, Sc, and/or Ce, and may include one or more metal elements selected from Al, Mg, and/or Be. The dielectric layer 300 may exhibit superior effects in terms of capacitance and leakage current of a capacitor compared to a dielectric layer including two metal elements. For example, a dielectric layer including three metal elements Zr, Al, and Y may exhibit higher capacitance than a dielectric layer including Zr and Al and a dielectric layer including Zr and Y.

In addition, positions of the second metal oxide layer 320 and the third metal oxide layer 330 in the dielectric layer may affect the capacitance and leakage current of the capacitor. For example, when the third metal oxide layer 330 is disposed closer to an electrode than the second metal oxide layer 320, the capacitance of the capacitor may be higher and a leakage current value may be smaller compared to when the second metal oxide layer 320 is disposed closer to the electrode than the third metal oxide layer 330.

A thickness of the dielectric layer 300 may be greater than or equal to 20 Å and/or less than or equal to 100 Å. For example, the dielectric layer 300 may have a thickness greater than or equal to 25 Å, greater than or equal to 30 Å, greater than or equal to 35 Å, less than or equal to 90 Å, less than or equal to 80 Å, less than or equal to 70 Å, and/or less than or equal to 60 Å.

The first metal oxide layer 310 may be disposed adjacent to the lower electrode 100 and may have a thickness greater than or equal to 40% of a total thickness of the dielectric layer 300. For example, the thickness of the first metal oxide layer 310 may be greater than or equal to 45%, greater than or equal to 50%, greater than or equal to 55%, greater than or equal to 60%, greater than or equal to 65%, less than or equal to 90%, less than or equal to 85%, less than or equal to 80%, and/or less than or equal to 75% of the total thickness of the dielectric layer 300. For example, the thickness of the first metal oxide layer 310 may be greater than or equal to 10 Å, greater than or equal to 15 Å, greater than or equal to 20 Å, less than or equal to 50 Å, less than or equal to 45 Å, less than or equal to 40 Å, and/or less than or equal to 35 Å.

A thickness of the second metal oxide layer 320 may be greater than or equal to 5 Å, greater than or equal to 10 Å, greater than or equal to 15 Å, greater than or equal to 20 Å, less than or equal to 50 Å, less than or equal to 45 Å, less than or equal to 40 Å, and/or less than or equal to 35 Å. The thickness of the second metal oxide layer 320 may be greater than or equal to 1%, greater than or equal to 3%, greater than or equal to 5%, greater than or equal to 8%, greater than or equal to 10%, less than or equal to 50%, less than or equal to 40%, less than or equal to 35%, less than or equal to 20%, and/or less than or equal to 10% of the total thickness of the dielectric layer 300. The thickness of the second metal oxide layer 320 may be less than the thickness of the first metal oxide layer 310.

A thickness of the third metal oxide layer 330 may be greater than or equal to 1 Å, greater than or equal to 2 Å, greater than or equal to 5 Å, greater than or equal to 10 Å, less than or equal to 30 Å, less than or equal to 25 Å, less than or equal to 20 Å, and/or less than or equal to 15 Å. The thickness of the third metal oxide layer 330 may be greater than or equal to 0.1%, greater than or equal to 0.5%, greater than or equal to 1%, greater than or equal to 3%, greater than or equal to 5%, less than or equal to 30%, less than or equal to 25%, less than or equal to 20%, less than or equal to 15%, less than or equal to 10%, and/or less than or equal to 5% of the total thickness of the dielectric layer 300. The thickness of the third metal oxide layer 330 may be less than the thickness of the first metal oxide layer 310.

A boundary between the first metal oxide layer 310, the second metal oxide layer 320, and the third metal oxide layer 330 may be unclear. For example, the boundary between the first metal oxide layer 310 and the second metal oxide layer 320, between the second metal oxide layer 320 and the third metal oxide layer 330, and/or between the first metal oxide layer 310, the second metal oxide layer 320, and the third metal oxide layer 330 may be unclear. For example, when the first metal oxide layer 310, the second metal oxide layer 320, and/or the third metal oxide layer 330 include a similar composition and/or have a small thickness, the boundary between the first metal oxide layer 310, the second metal oxide layer 320, and the third metal oxide layer 330 and an adjacent layer may not be clearly distinguished due to the diffusion of materials therebetween.

The capacitor 1 may further include an interfacial layer (not shown) between the lower electrode 100 and the dielectric layer 300 and/or between the upper electrode 200 and the dielectric layer 300. The interfacial layer may function as a barrier layer preventing diffusion and/or movement of impurities between the lower electrode 100 and the dielectric layer 300 and/or between the upper electrode 200 and the dielectric layer 300. For example, the interfacial layer may reduce the potential for and/or prevent some atoms (e.g., nitrogen atoms) included in the upper and lower electrodes 100 and 200 from penetrating into the dielectric layer 300, and may reduce the potential for and/or prevent some atoms (e.g., oxygen atoms) included in the dielectric layer 300 from diffusing to the upper and lower electrodes 100 and 200. The interfacial layer may include a transition metal oxide having electrical conductivity, and/or may include, for example, a metal oxide such as titanium oxide, tantalum oxide, niobium oxide, molybdenum oxide, etc., and/or a metal oxynitride such as titanium oxynitride (TiON), tantalum oxynitride (TaON), niobium oxynitride (NbON), molybdenum oxynitride (MoON), etc. For example, in some embodiments the interfacial layer may include an oxide of a metal included in the lower electrode 100 and/or the upper electrode 200. For example, the lower electrode 100 may include a metal nitride expressed as MM'N, and the interfacial layer between the lower electrode 100 and the dielectric layer 300 may include a metal oxynitride expressed as MM'ON. The interfacial layer may be formed to have a thickness such that it is difficult to function as a dielectric layer. For example, the interfacial layer may, in some embodiments, not be thick enough to prevent and/or mitigate electron tunneling. The interfacial layer may have a thickness of, for example, about 1 Å to about 10 Å.

A capacitor according to another embodiment may include a dielectric layer including one or more first metal (and/or metalloid) elements selected from Hf, Zr, Nb, Ta, Pr, Nd, Gd, Dy, Yb, Pb, Zn, Si, Ti, and/or Lu, one or more second metal elements selected from Y, Sc, and Ce, and one or more third metal elements selected from Al, Mg, and Be between an upper electrode and a lower electrode. The second metal element and the third metal element may have a concentration gradient in a thickness direction of the dielectric layer.

Figure 2:
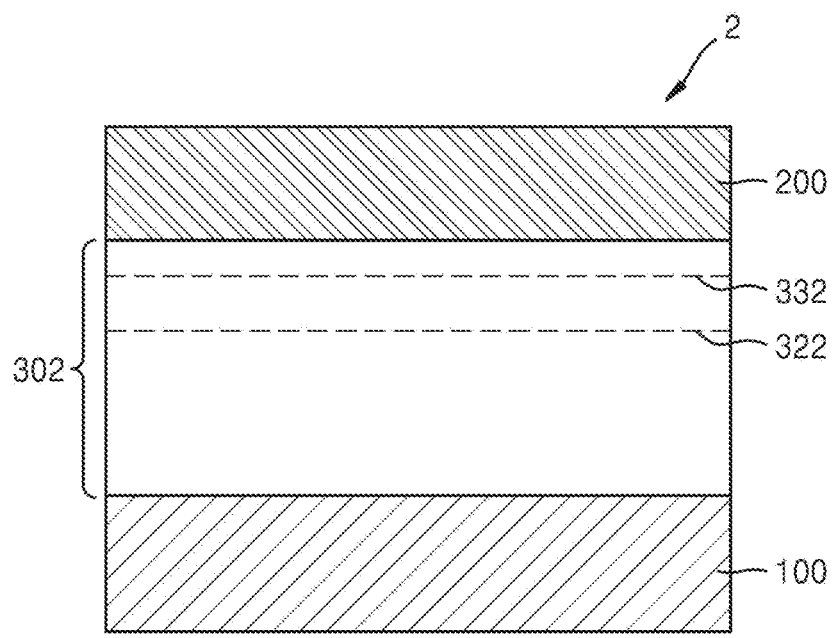

Referring to FIG. 2, the capacitor 2 may include the lower electrode 100, the upper electrode 200 disposed spaced apart from the lower electrode 100, and a dielectric layer 302 disposed between the lower electrode 100 and the upper electrode 200. The dielectric layer 302 may include a second metal element and a third metal element having a maximum concentration at different positions. For example, the second metal element may have a maximum concentration (and/or content) at a position 322, and may be, for example, separated from the lower electrode 100 by greater than or equal to 40%, greater than or equal to 45%, greater than or equal to 50%, greater than or equal to 55%, greater than or equal to 60%, greater than or equal to 65%, less than or equal to 90%, less than or equal to 85%, less than or equal to 80%, and/or less than or equal to 75% of a thickness of the dielectric layer 302. In addition, the third metal element may have a maximum concentration (and/or content) at a position 332 separated from the upper electrode 200 by greater than 0%, greater than or equal to 1%, greater than or equal to 3%, greater than or equal to 5%, less than or equal to 20%, less than or equal to 15%, less than or equal to 10%, and/or less than or equal to 5% of the thickness of the dielectric layer 302.

The first metal (and/or metalloid) element, the second metal element, and/or the third metal element may be included in the dielectric layer 302 in an appropriate amount depending on a dielectric constant of a desired dielectric layer, a leakage current value of the capacitor 2a, 2b, etc. For example, a ratio of the content of the second metal element to a total metal element in the dielectric layer 302 may be greater than 0.0 at %, greater than or equal to 0.2 at %, greater than or equal to 0.3 at %, greater than or equal to 0.5 at %, less than or equal to 5.0 at %, less than or equal to 4.5 at %, less than or equal to 4.0 at %, less than or equal to 3.5 at %, less than or equal to 3.0 at %, less than or equal to 2.5 at %, less than or equal to 2.0 at %, and/or less than or equal to 1.5 at %. A ratio of the content of the third metal element to the total metal element in the dielectric layer 302 may be greater than 0.0 at %, greater than or equal to 0.3 at %, greater than or equal to 0.5 at %, greater than or equal to 1.0 at %, greater than or equal to 1.5 at %, greater than or equal to 2.0 at %, less than or equal to 5.0 at %, less than or equal to 4.5 at %, less than or equal to 4.0 at %, less than or equal to 3.5 at %, less than or equal to 3.0 at %, and/or less than or equal to 1.5 at %. A ratio of the content of the first metal element to the total metal element in the dielectric layer 302 may be greater than or equal to 80 at %, greater than or equal to 85 at %, greater than or equal to 90 at %, greater than or equal to 92 at %, greater than or equal to 94 at %, greater than or equal to 95 at %, less than 100 at %, less than or equal to 98 at % and/or less than or equal to 96 at %. In addition, a ratio of the content of the second metal element to the content of the third metal element in the dielectric layer 302 may be greater than or equal to 10%, greater than or equal to 20%, greater than or equal to 30%, less than or equal to 200%, less than or equal to 170%, and/or less than or equal to 150%.

The lower electrode 100, the upper electrode 200, and an interfacial layer (not shown) are the same as described above, and the description of the dielectric layer 302 may be as that of the description of the dielectric layer 300 above.

Figure 3A:
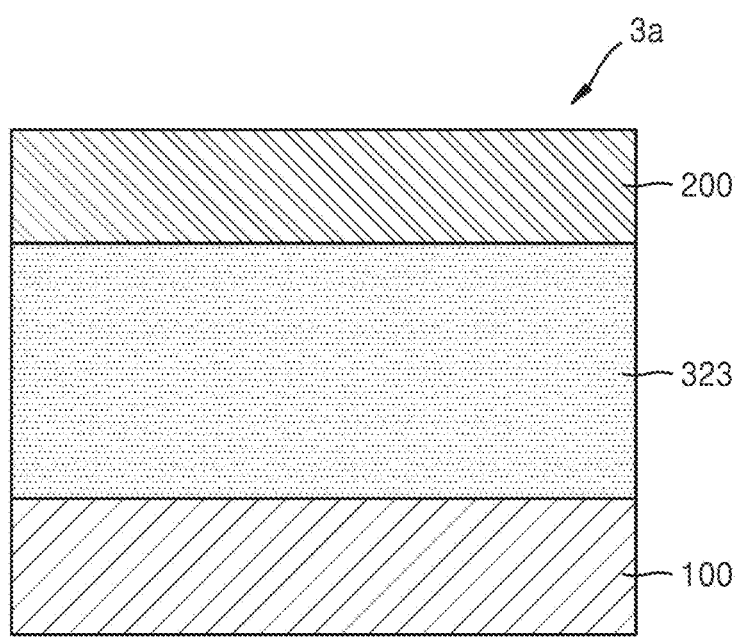

Referring to FIG. 3a, a capacitor 3a according to another embodiment may include a metal oxide layer 323 including a compound expressed as AxByOz (A is one or more metal elements selected from Y, Sc, and/or Ce, B is one or more elements selected from Hf, Zr, Nb, Ta, Pr, Nd, Gd, Dy, Yb, Pb, Zn, Si, Ti, Sr, and/or Lu, x+y+z=1, and 0<x≤0.2, 0<y≤0.5) between the upper electrode 200 and the lower electrode 100. The compound expressed as AxByOz may have x greater than 0.0 and/or less than or equal to 0.15, and y greater than or equal to 0.2, less than or equal to 0.5 and/or less than or equal to 0.4. In addition, a thickness of the metal oxide 323 layer may be greater than or equal to 10 Å, greater than or equal to 15 Å, greater than or equal to 20 Å, less than or equal to 50 Å, less than or equal to 45 Å, and/or less than or equal to 40 Å.

Figure 3B:
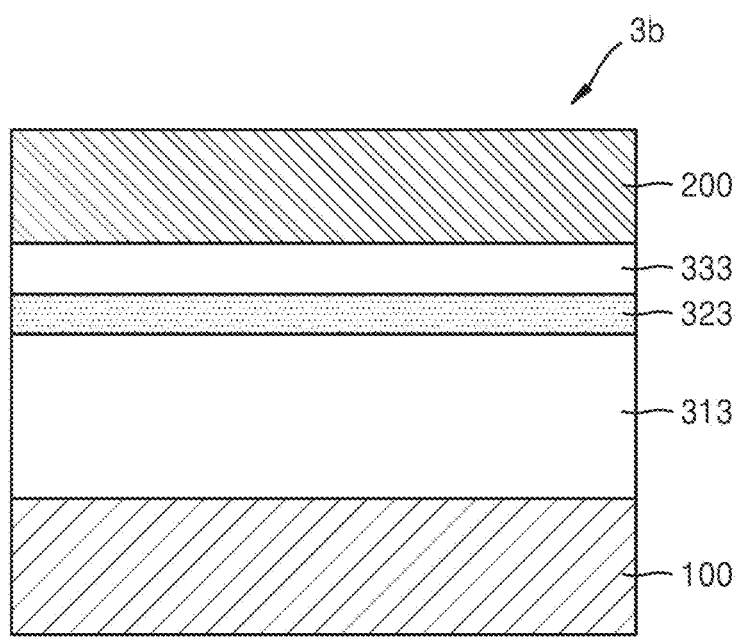

Referring to FIG. 3b, the capacitor 3b may further include a metal oxide layer 333 including one or more metals selected from Al, Mg, and Be between the upper electrode 200 and the metal oxide layer 323 and may further include a metal oxide layer 313 including one or more metals selected from Hf, Zr, Nb, Ta, Pr, Nd, Gd, Dy, Yb, Pb, Zn, Ti, Al and/or Lu between the metal oxide layer 323 and the lower electrode 100. For example, the metal oxide layer 313 may include hafnium oxide ($HfO_2$); hafnium silicon oxide ($HfSiO_4$); zirconium oxide ($ZrO_2$); hafnium zirconium oxide ($HfZrO_2$); zirconium silicon oxide ($ZrSiO_4$); tantalum oxide ($Ta_2O_5$); titanium oxide ($TiO_2$); strontium titanium oxide ($SrTiO_3$); red zinc niobate ($PbZnNbO_3$); a metal nitride oxide such as aluminum oxynitride (AlON), zirconium oxynitride (ZrON), hafnium oxynitride (HfON), etc.; a silicate such as ZrSiON, HfSiON, etc.; and/or an aluminate such as ZrAlON, HfAlON, etc.

The capacitors 1, 2, and 3 may each have a low leakage current value. For example, the capacitors 1, 2, and 3 may each represent a leakage current value less than or equal to $1.0 \times 10^{-4}$ A/cm$^2$, less than or equal to $5.0 \times 10^{-5}$ A/cm$^2$, less than or equal to $1.0 \times 10^{-5}$ A/cm$^2$, less than or equal to $5.0 \times 10^{-6}$ A/cm$^2$, and/or less than or equal to $1.0 \times 10^{-6}$ A/cm$^2$ when a voltage of 1.0 V is applied.

A semiconductor apparatus (for example, a capacitor) according to embodiments may be manufactured by forming the lower electrode 100 on a substrate, the dielectric layer 300 including the first, second, and third metal oxide layers 310, 320, and 330 each having a desired composition and thickness on the lower electrode 100, and forming the upper electrode 200 on the dielectric layer 300. The lower electrode 100, the dielectric layer 300, and the upper electrode 200 may be formed through a method known in the art. For example, the lower electrode 100, the dielectric layer 300, and the upper electrode 200 may be independently formed through deposition methods such as Atomic Layer Deposition (ALD), Chemical Vapor Deposition (CVD), Physical Vapor Deposition (PVD), and/or sputtering. Among the deposition methods, the ALD method has the advantage of forming a uniform layer in atomic units and being performed at a relatively low temperature.

In some embodiments, the lower electrode 100, the dielectric layer 300, and the upper electrode 200 may be formed independently by repeating a deposition cycle including operations of supplying a metal precursor, purging the metal precursor, supplying a reactive gas (for example, a nitriding agent and/or an oxygen source), and purging the reactive gas once and/or a plurality of times.

For example, the lower electrode 100 and/or the upper electrode 200 including a metal nitride may be manufactured by supplying a precursor and a nitriding agent on a substrate or a dielectric layer and reacting the precursor and the nitriding agent at an appropriate temperature. A process temperature may be appropriately adjusted according to a thermal stability of the precursor and/or the nitriding agent, and may be higher than or equal to 100° C. and/or lower than or equal to 700° C.

The precursor may be an organic compound expressed as $MR_x$ or $M'R_x$. M or M' is the same as described above, R may be one or more of a $C_1$ to $C_{10}$ alkyl group, a $C_2$ to $C_{10}$ alkenyl group, a carbonyl group (C=O), a halide, a $C_6$ to $C_{10}$ aryl group, a $C_6$ to $C_{10}$ cycloalkyl group, a $C_6$ to $C_{10}$ cycloalkenyl group, (C=O)R (R is hydrogen or a $C_1$ to $C_{10}$ alkyl group), a $C_6$ to $C_{10}$ alkoxy group, a $C_6$ to $C_{10}$ amidinate, $C_6$ to $C_{10}$ alkylamides, $C_6$ to $C_{10}$ alkylamides, —N(Q)(Q') (Q and Q' are independently a $C_6$ to $C_{10}$ alkyl group or hydrogen), Q(C=O)CN (Q is hydrogen or a $C_6$ to $C_{10}$ alkyl group), and/or $C_6$ to $C_{10}$ β-diketonates, and x may be greater than 0 and less than or equal to 6.

The precursor may be a halide expressed as $MH_y$ or $M'H_y$. M or M' is the same as described above, and H may include one or more of F, Cl, Br, and I. y may be greater than 0 and less than or equal to 6.

The nitriding agent may be a reactive gas including a nitrogen element, and may include, for example, at least one of $NH_3$, $N_2H_2$, $N_3H$, and/or $N_2H_4$.

A precursor that does not react after having been supplied to the substrate or the dielectric layer 300, a reactive gas (e.g., a nitriding agent), and/or a by-product thereof may be removed by purging. For purging, an inert gas such as Ar, He, and/or Ne and/or an $N_2$ gas may be used.

An interfacial layer (not shown) may be formed on the lower electrode 100 after the lower electrode 100 is formed or on the dielectric layer 300 after the dielectric layer 300 is formed. The interfacial layer may be formed by providing a precursor and/or a source of an element forming the interfacial layer on the lower electrode 100 and/or on the dielectric layer 300. Alternatively, the interfacial layer may be formed by providing an oxygen supply source to the lower electrode 100 and oxidizing a part of a surface of the lower electrode 100.

The dielectric layers 300 and 302 may be formed to have a desired composition, concentration, and/or thickness by providing a first metal precursor, a second metal precursor, a third metal precursor, and an oxygen source on the lower electrode 100, and adjusting a supply order, a supply time, and an amount of supply of the first precursor, the second precursor, the third precursor, and the oxygen source. For example, the dielectric layers 300 and 302 may be formed through operations of providing a first precursor (e.g., a zirconium precursor) and an oxygen source on the lower electrode 100 to form the first metal oxide layer 310, providing the first precursor (e.g., the zirconium precursor), a second precursor (e.g., an yttrium precursor) and the oxygen source on the first metal oxide layer 310 to form the second metal oxide layer 320, and providing a third precursor (e.g., an aluminum precursor) and the oxygen source on the second metal oxide layer 320 to form the third metal oxide layer 330. The first precursor, the second precursor, the third precursor, and/or the oxygen source may be simultaneously and/or intermittently/crosswise provided on the lower electrode 100. For example, two or more of the first precursor, the second precursor, the third precursor, and the oxygen source may be simultaneously provided on the lower electrode 100 through two or more injection holes, and/or the first precursor, the second precursor, the third precursor, and the oxygen source may be sequentially provided on the lower electrode 100.

In the dielectric layers 300 and 302, the composition, concentration, and/or thickness of metal elements in the layer may be changed by material diffusion. For example, the third metal oxide layer 330 may further include one or more elements selected from Hf, Zr, Nb, Ta, Pr, Nd, Gd, Dy, Yb, Pb, Zn, Si, Ti, Sr, Al, and/or Lu by the material diffusion of the second metal oxide layer 320 adjacent thereto, and a content and concentration of Al, Mg, and/or beryllium (Be) and/or a position in the dielectric layer may be different.

A precursor such as the first precursor, the second precursor, and/or the third precursor may independently be a metal (and/or metalloid) organic compound expressed as $AR_x$, $BR_x$, or $CR_x$; where A is a first metal (or metalloid) element, B is a second metal (or metalloid) element, C is a third metal (or metalloid) element, R may be one or more of a $C_1$ to $C_{10}$ alkyl group, a $C_2$ to $C_{10}$ alkenyl group, a carbonyl group (C=O), a halide, a $C_6$ to $C_{10}$ aryl group, a $C_6$ to $C_{10}$ cycloalkyl group, a $C_6$ to $C_{10}$ cycloalkenyl group, (C=O)R (R is hydrogen or a $C_1$ to $C_{10}$ alkyl group), a $C_6$ to $C_{10}$ alkoxy group, a $C_6$ to $C_{10}$ amidinate, $C_6$ to $C_{10}$ alkylamides, $C_6$ to $C_{10}$ alkylamides, —N(Q)(Q') (Q and Q' are independently a $C_6$ to $C_{10}$ alkyl group or hydrogen), Q(C=O)CN (Q is hydrogen or a $C_6$ to $C_{10}$ alkyl group), and $C_6$ to $C_{10}$ β-diketonates, and x may be greater than 0 and less than or equal to 6.

$O_3$, $H_2O$, $O_2$, $N_2O$, $O_2$, and/or plasma may be used as the oxygen source. Heat treatment may be performed on the dielectric layers 300 and 302 and/or the first, second, and third metal oxide layers 310, 320 and 330. For example, heat treatment may be performed after the dielectric layers 300 and 302, and/or the upper electrode 200, are formed. As another example, heat treatment may be performed after the first metal oxide layer 310, the second metal oxide layer 320, and/or the third metal oxide layer 330 are formed. During a heat treatment process, metal elements in the dielectric layers 300 and 302 may materially diffuse, and metal oxides in the dielectric layers 300 and 302 and/or the first and second metal oxide layers 310 and 320 may be partly or completely crystallized, and/or the size of crystal grains may increase.

Heat treatment may be performed at a temperature of about 400° C. to about 1100° C., but is not limited thereto. Heat treatment may be performed for a period of time greater than or equal to 1 nano-second, greater than or equal to 1 micro-second, greater than or equal to 0.001 seconds, greater than or equal to 0.01 seconds, greater than or equal to 0.05 seconds, greater than or equal to 1 second, greater than or equal to 3 seconds, greater than or equal to 5 seconds, less than or equal to 10 minutes, less than or equal to 5 minutes, less than or equal to 1 minute, and/or less than or equal to 30 seconds, but is not limited thereto.

According to another aspect, a semiconductor apparatus may be provided. The semiconductor apparatus may have memory characteristics, and may be, for example, dynamic random-access memory (DRAM). In addition, in the semiconductor apparatus, a field effect transistor and a capacitor may be electrically connected, and the capacitor may be the aforementioned semiconductor apparatus.

Figure 4A:
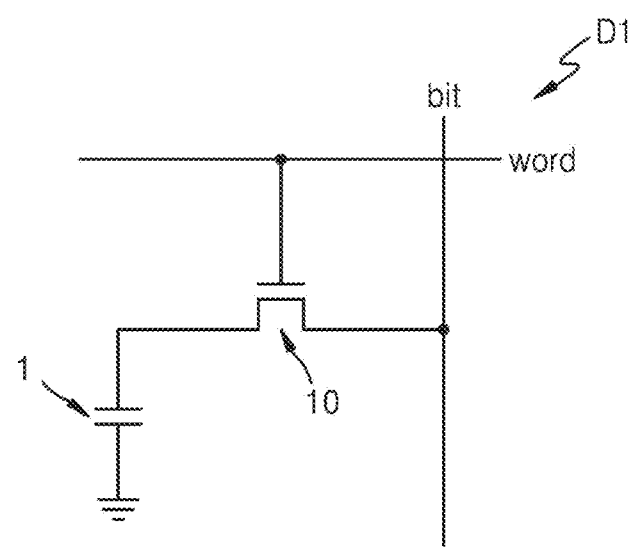
FIG. 4A illustrates a circuit configuration of a memory cell of a memory device including a semiconductor device and a capacitor.
Figure 4B:
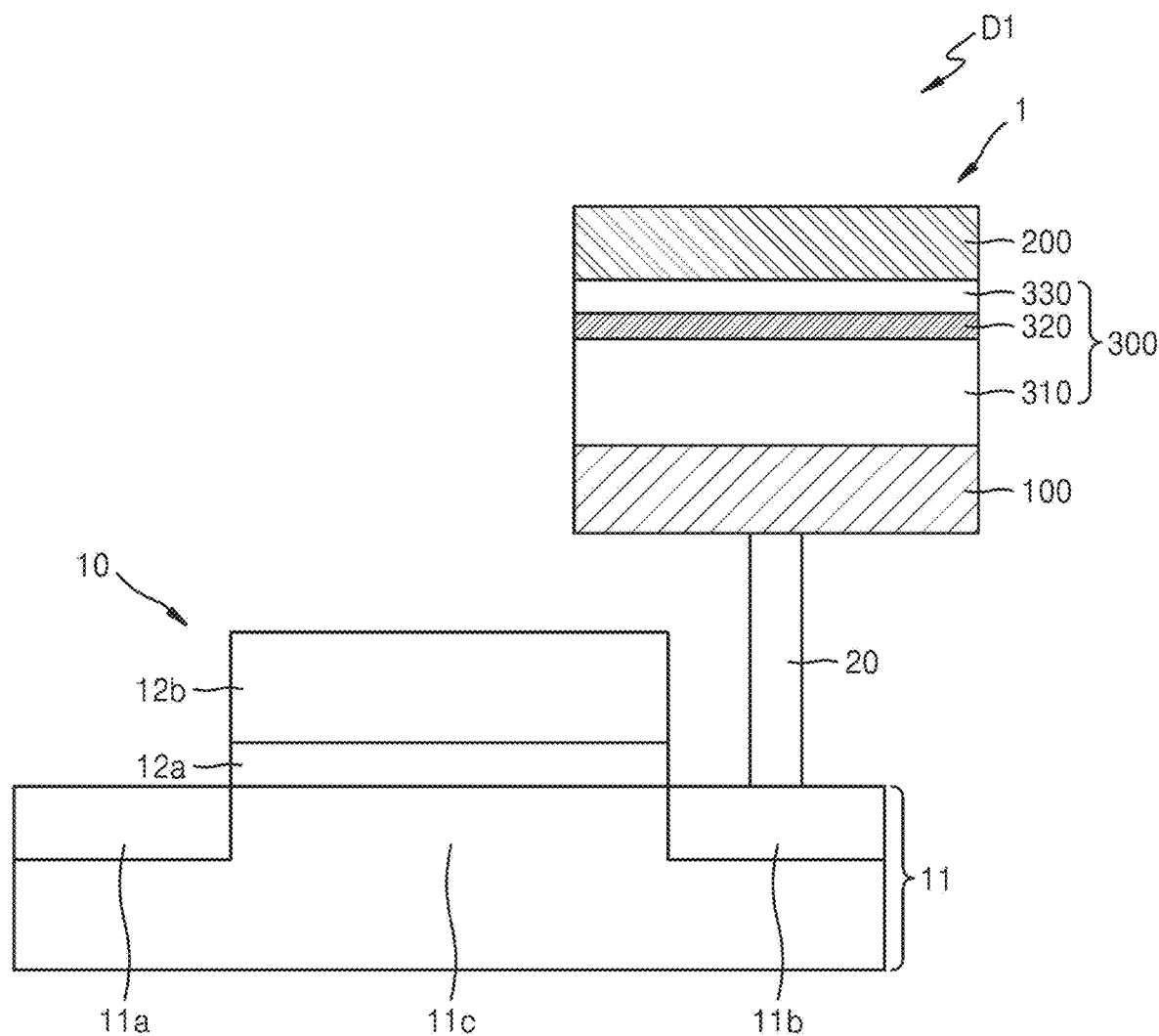
FIG. 4B is a schematic diagram of a semiconductor apparatus according to some embodiments.

FIG. 4A illustrates a circuit configuration of a memory cell of a memory device including a semiconductor device and a capacitor. FIG. 4B is a schematic diagram showing a semiconductor apparatus D1 (a connection structure including the capacitor 1 and a field effect transistor 10) according to an embodiment. FIGS. 4A-4B illustrate an example of the semiconductor apparatus D1 including the capacitor 1 of FIG. 1, but the semiconductor apparatus D1 may include the capacitor 2a-2b of FIGS. 2B-2B, and/or the capacitor 3 of FIG. 3.

Referring to FIG. 4A, the semiconductor apparatus D1 may be included in a memory device such as a memory cell, and may include a transistor 10 and a capacitor 1 electrically connected to, for example, a source region 11b of the transistor 10. The memory device may include a plurality of bit lines and a plurality of word lines, and may further include a plurality of the memory cells. Each word line may be electrically connected to a gate electrode 12b of the transistor 10, and each bit line may be electrically connected to a drain region 11a of the transistor 10. An electrode of the capacitor 1 may be connected to, for example, a voltage controller (not shown).

Referring to FIG. 4B, the semiconductor apparatus D1 may have a structure in which the capacitor 1 including the dielectric layer 300 and the field effect transistor 10 are electrically connected by a contact 20. For example, one of the lower and upper electrodes 100 and 200 of the capacitor 1 and one of the source 11a and the drain 11b of the field effect transistor 10 may be electrically connected by the contact 20.

The field effect transistor 10 may include a substrate 11 and a gate electrode 12b disposed to face a channel 11c. A gate insulating layer 12a may be further included between the substrate 11 and the gate electrode 12b.

The substrate 11 may include a semiconductor material. The substrate 11 may include a semiconductor material such as silicon (Si), germanium (Ge), silicon germanium (SiGe), silicon carbide (SiC), gallium arsenic (GaAs), indium arsenic (InAs), indium phosphide (InP), etc. and may be changed and used in various forms such as a silicon on insulator (SOI).

The substrate 11 may include the source 11a, the drain 11b, and the channel 11c electrically connected to and/or between the source 11a and the drain 11b. The source 11a may be electrically connected or contact with one end of the channel 11c, and the drain 11b may be electrically connected or contact with the other end of the channel 11c. In some embodiments, the channel 11c may be defined as a substrate region between the source 11a and the drain 11b in the substrate 11.

The source 11a, the drain 11b, and the channel 11c may be independently formed by implanting impurities into different regions of the substrate 11. In this case, the source 11a, the channel 11c, and the drain 11b may include a substrate material as a base material.

In addition, the source 11a and the drain 11b may include a conductive material, for example, may independently include a metal, a metal compound, or a conductive polymer.

In some embodiments, the channel 11c may be implemented as and/or include a separate material layer (a thin film) (not shown). In this case, for example, the channel 11c may include not only a semiconductor material such as Si, Ge, SiGe, Group III-V elements, etc., but also an oxide semiconductor, a nitride semiconductor, an oxynitride semiconductor, a two-dimensional material (2D material), quantum dots, and/or an organic semiconductor. For example, the oxide semiconductor may include InGaZnO, etc.; the two-dimensional material may include transition metal dichalcogenide (TMD) or graphene; and the quantum dots may include colloidal QDs, and a nanocrystal structure.

The gate electrode 12b may be spaced apart from the substrate 11 and disposed on the substrate 11 to face the channel 11c. The gate electrode 12b may have a conductivity less than or equal to 1 Mohm/square. The gate electrode 12b may include metal, metal nitride, metal carbide, and/or polysilicon. For example, the metal may include aluminum (Al), tungsten (W), molybdenum (Mo), titanium (Ti), and/or tantalum (Ta), and the metal nitride may include a titanium nitride (TiN) film and/or a tantalum nitride film (TaN film). The metal carbide may be a metal carbide doped (and/or including) with aluminum and/or silicon, and may include TiAlC, TaAlC, TiSiC, or TaSiC as some examples. The gate electrode 12b may have a structure in which a plurality of materials are stacked, and may include, for example, a stack structure of a metal nitride layer/metal layer such as TiN/Al, or a stack structure of a metal nitride layer/metal carbide layer/metal layer such as TiN/TiAlC/W. The gate electrode 12b may include a titanium nitride film (TiN) or molybdenum (Mo), and the above example may be used in various modifications.

The gate insulating layer 12a may be further disposed between the substrate 11 and the gate electrode 12b. The gate insulating layer 12a may include a phase dielectric material or a high dielectric material, and may have a dielectric constant of about 20 to about 70. The gate insulating layer 12a may include silicon oxide, silicon nitride, aluminum oxide, hafnium oxide, zirconium oxide, etc., or may include a 2D insulator such as hexagonal boron nitride (h-BN). For example, the gate insulating layer 12a may include silicon oxide ($SiO_2$), silicon nitride ($SiN_x$), etc., and may include hafnium oxide ($HfO_2$), hafnium silicon oxide ($HfSiO_4$), lanthanum oxide ($La_2O_3$), and lanthanum aluminum oxide ($LaAlO_3$), zirconium oxide ($ZrO_2$), hafnium zirconium oxide ($HfZrO_2$), zirconium silicon oxide ($ZrSiO_4$), tantalum oxide ($Ta_2O_5$), titanium oxide ($TiO_2$), strontium titanium oxide ($SrTiO_3$), yttrium oxide ($Y_2O_3$), aluminum oxide ($Al_2O_3$), red scandium tantalum oxide ($PbSc_{0.5}Ta_{0.5}O_3$), red zinc niobate ($PbZnNbO_3$), etc. In addition, the gate insulating layer 12a may include a metal nitride oxide such as aluminum oxynitride (AlON), zirconium oxynitride (ZrON), hafnium oxynitride (HfON), lanthanum oxynitride (LaON), yttrium oxynitride (YON), etc., a silicate such as ZrSiON, HfSiON, YSiON, and LaSiON, or an aluminate such as ZrAlON or HfAlON. In addition, the gate insulating layer 12a may include the dielectric layers 300 and 302 described above. The gate insulating layer 12a may form a gate stack together with the gate electrode 12b.

The contact 20 may include an appropriate conductive material, such as tungsten, copper, aluminum, polysilicon, etc. In some embodiments, the contact 20 may be omitted.

For example, the lower electrode 100 may be disposed to directly contact the source 11a and/or drain 11b. In this case, a conductive material included in the source 11a and/or drain 11b and/or the lower electrode may function as the contact 20.

The arrangement of the capacitor 1 and the field effect transistor 10 may be variously modified. For example, the capacitor 1 may be disposed on the substrate 11 or may have a structure buried in the substrate 11.

Figure 5:
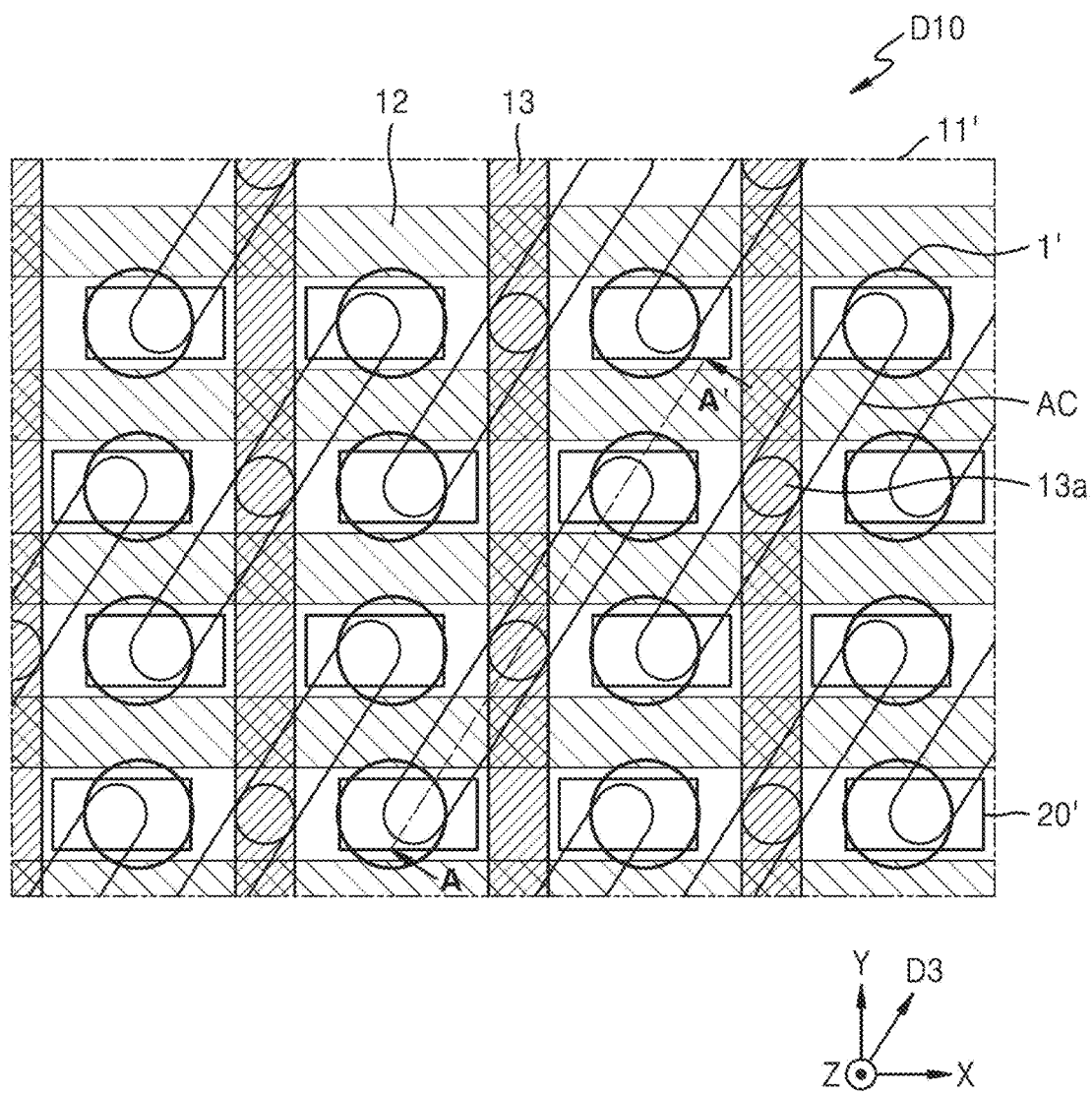
FIG. 5 is a layout diagram of a semiconductor apparatus according to some embodiments.

FIG. 4 schematically illustrates a semiconductor apparatus D1 including one capacitor 1 and one field effect transistor 10, but as shown in FIG. 5, a semiconductor apparatus D10 may have a structure in which a plurality of capacitors and a plurality of field effect transistors are repeatedly arranged. Referring to FIG. 5, the semiconductor apparatus D10 includes a field effect transistor including a substrate 11' including a source, a drain, and a channel, and a gate stack 12, a contact structure 20' disposed on the substrate 11' so as not to overlap the gate stack 12, and a capacitor 1' disposed on the contact structure 20', and may further include a bit line structure 13 electrically connecting a plurality of field effect transistors. FIG. 5 illustrates the semiconductor apparatus D10 in which both the contact structure 20' and the capacitor 1' are repeatedly arranged in X and Y directions, but is not limited thereto. For example, the contact structure 20' may be arranged in the X and Y directions, and the capacitor 1' may be arranged in a hexagonal shape such as a honeycomb structure.

Figure 6:
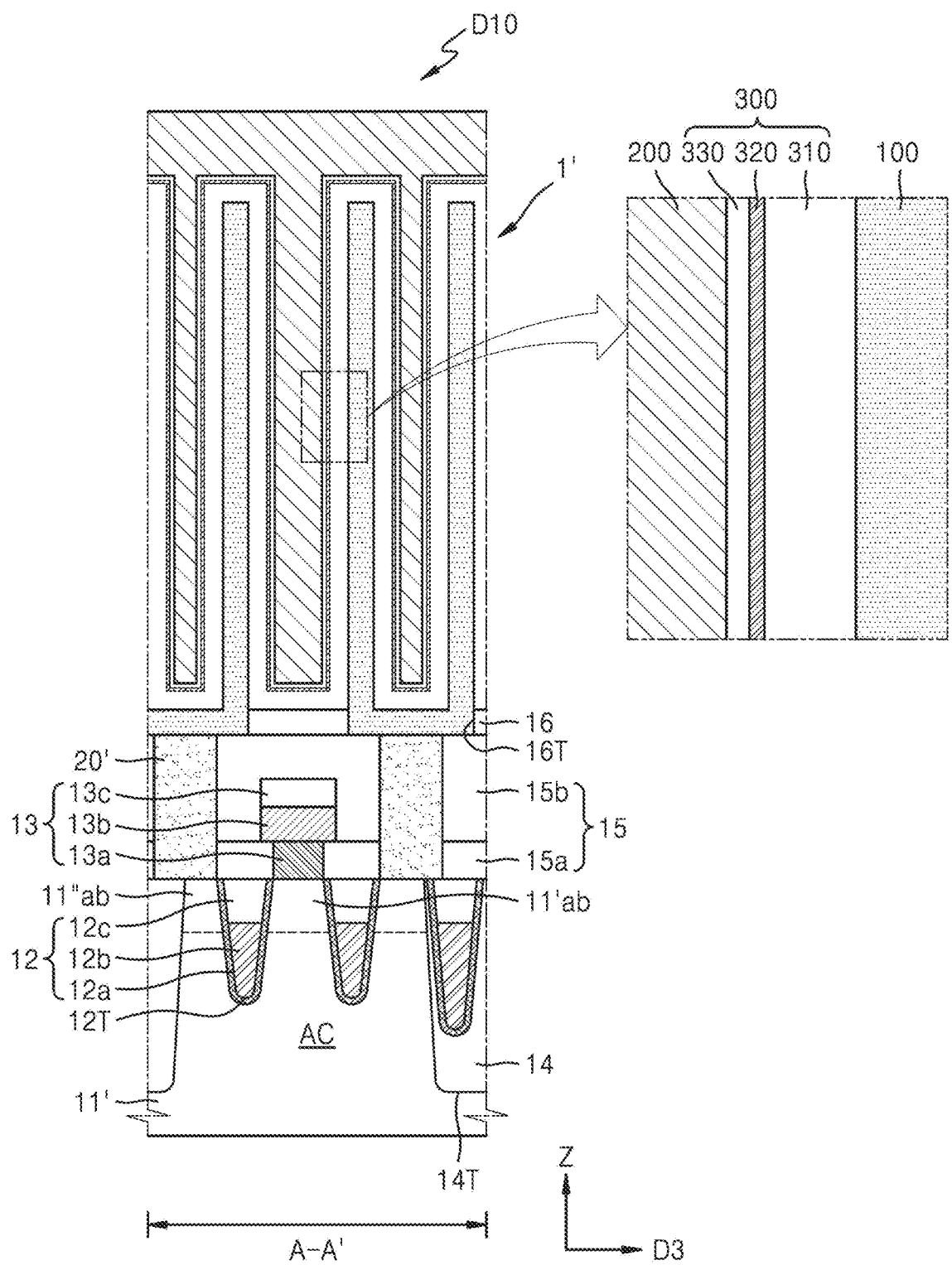
FIG. 6 is a cross-sectional view of the semiconductor apparatus of FIG. 5, taken along line A-A'.
Figure 7:
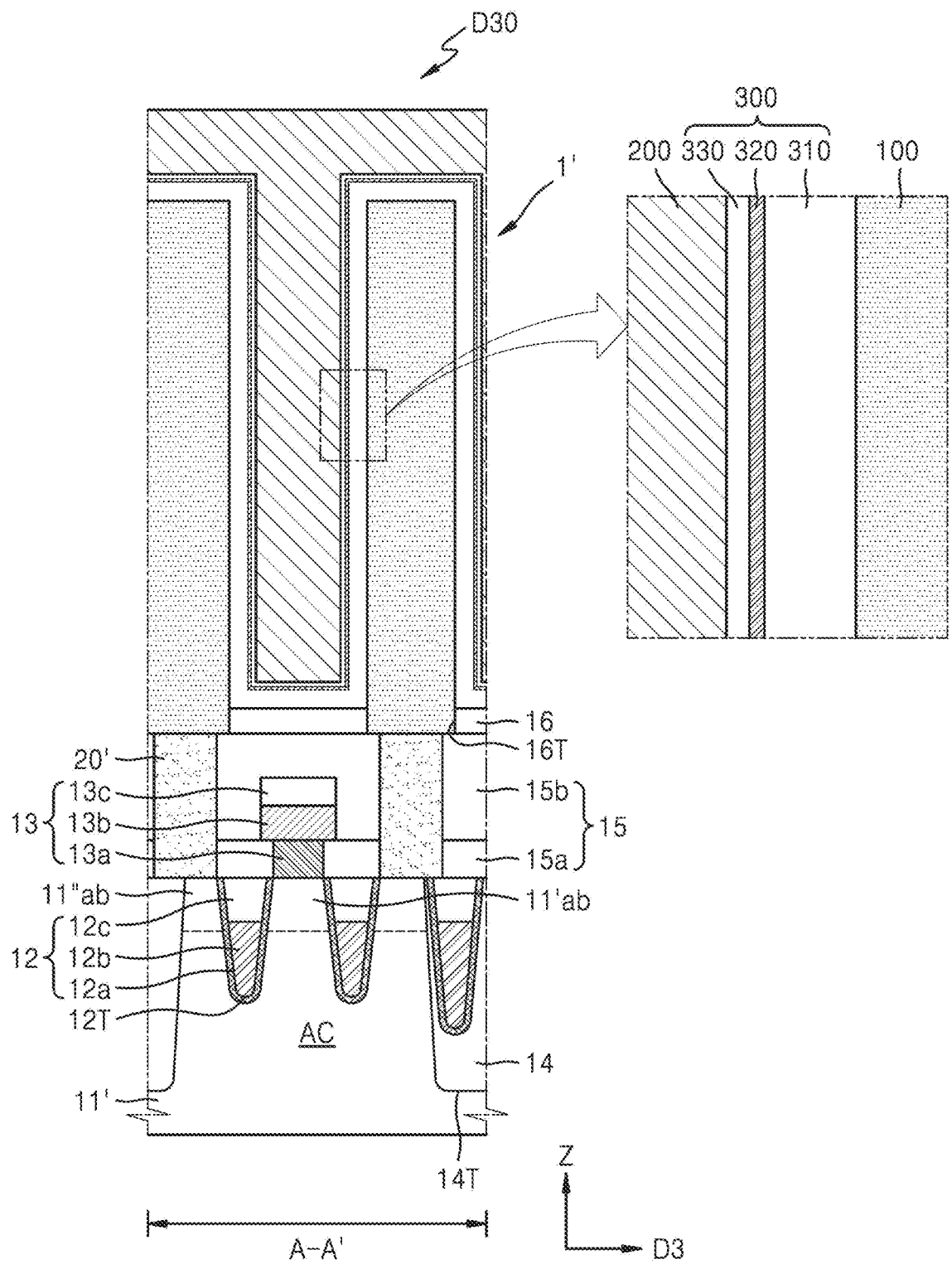
FIG. 7 is a cross-sectional view showing a modified example of FIG. 6.

FIG. 6 is an example of a cross-sectional view of the semiconductor apparatus D10 of FIG. 5, taken along line A-A'. FIG. 7 shows a modified example of FIG. 6.

Referring to FIGS. 6 and 7, the substrate 11' may have a shallow trench isolation (STI) structure including a device isolation layer 14. The device isolation layer 14 may be a single layer of one type of insulating layer or a multilayer of a combination of two or more types of insulating layers. The device isolation layer 14 may include a device isolation trench 14T in the substrate 11', and the device isolation trench 14T may be filled with an insulating material. The insulating material may include, for example, FSG (fluoride silicate glass), USG (undoped silicate glass), BPSG (borophospho-silicate glass), PSG (phospho-silicate glass), FOX (flowable oxide), PE-TEOS (plasma enhanced tetra-ethyl-ortho-silicate), and/or TOSZ (tonen silazene), but is not limited thereto.

In addition, the substrate 11' may further include an active region AC defined by the device isolation layer 14 and a gate line trench 12T disposed parallel to an upper surface of the substrate 11' and extending in the X direction. The active region AC may have a relatively long island shape having a short axis and a long axis. The long axis of the active region AC may be arranged in a direction D3 parallel to the upper surface of the substrate 11' as illustrated in FIG. 5. The gate line trench 12T may be disposed to cross the active region AC or in the active region AC at a predetermined (and/or otherwise desired) depth from the upper surface of the substrate 11'. The gate line trench 12T may also be disposed inside the device isolation trench 14T, and the gate line trench 12T inside the device isolation trench 14T may have a lower bottom surface than the gate line trench 12T of the active region AC.

A first source/drain 11'ab and a second source/drain 11"ab may be disposed on an upper portion of the active region AC positioned on both sides of the gate line trench 12T.

The gate stack 12 may be disposed inside the gate line trench 12T. for example, a gate insulating layer 12a, a gate electrode 12b, and a gate capping layer 12c may be sequentially disposed inside the gate line trench 12T. The gate insulating layer 12*a* and the gate electrode 12*b* may refer to the above description, and the gate capping layer 12*c* may include silicon oxide, silicon oxynitride, and/or silicon nitride. The gate capping layer 12*c* may be disposed on the gate electrode 12*b* to fill a remaining part of the gate line trench 12T.

Also, a bit line structure 13 may be disposed on the first source/drain 11'*ab*. The bit line structure 13 may be disposed to be parallel to the upper surface of the substrate 11' and extend in the Y direction. The bit line structure 13 may be electrically connected to the first source/drain 11'*ab*, and may sequentially include a bit line contact 13*a*, a bit line 13*b*, and a bit line capping layer 13*c* on the substrate 11'. For example, the bit line contact 13*a* may include polysilicon, the bit line 13*b* may include a metal material, and the bit line capping layer 13*c* may include an insulating material such as silicon nitride or silicon oxynitride. FIGS. 6 and 7 illustrate that the bit line contact 13*a* has the bottom surface of the same level as the upper surface of the substrate 11', but the bit line contact 13*a* may extend to an inside of a recess (not shown) formed at a predetermined (or otherwise desirable) depth from the upper surface of the substrate 11' such that the bottom surface of the bit line contact 13*a* may be lower than the upper surface of the substrate 11'.

Alternatively, the bit line structure 13 may include a bit line intermediate layer (not shown) between the bit line contact 13*a* and the bit line 13*b*. The bit line intermediate layer may include a metal silicide such as tungsten silicide and/or a metal nitride such as tungsten nitride. Also, a bit line spacer (not shown) may be further formed on the sidewall of the bit line structure 13. The bit line spacer may have a single layer structure or a multilayer structure, and may include an insulating material such as silicon oxide, silicon oxynitride, or silicon nitride. In addition, the bit line spacer may further include an air space (not shown).

The contact structure 20' may be disposed on the second source/drain 11"*ab*. The contact structure 20' and the bit line structure 13 may be disposed on different sources/drains on the substrate 11'. The contact structure 20' may be a structure in which a lower contact pattern (not shown), a metal silicide layer (not shown), and an upper contact pattern (not shown) are sequentially stacked on the second source/drain 11"*ab*. In addition, the contact structure 20' may further include a barrier layer (not shown) surrounding side surfaces and a bottom surface of the upper contact pattern. For example, the lower contact pattern may include polysilicon, the upper contact pattern may include a metal material, and the barrier layer may include a conductive metal nitride.

The capacitor 1' may be electrically connected to the contact structure 20' and disposed on the substrate 11'. For example, the capacitor 1' may include the lower electrode 100 electrically connected to the contact structure 20', the dielectric layer 300 disposed on the lower electrode 100, and the upper electrode 200 disposed on the dielectric layer 300. The dielectric layer 300 may be disposed on the lower electrode 100 so as to be parallel to the surface of the lower electrode 100.

The interlayer insulating layer 15 may be further disposed between the capacitor 1' and the substrate 11'. The interlayer insulating layer 15 may be disposed in a space in which no other structure is disposed between the capacitor 1' and the substrate 11'. The interlayer insulating layer 15 may be disposed to cover wiring such as the bit line structure 13, the contact structure 20', and the gate stack 12 on the substrate 11' and/or an electrode structure. For example, the interlayer insulating layer 15 may surround a wall of the contact structure 20'. The interlayer insulating layer 15 may include a first interlayer insulating layer 15*a* surrounding the bit line contact 13*a* and a second interlayer insulating layer 15*b* covering side and/or upper surfaces of the bit line 13*b* and the bit line capping layer 13*c*.

The lower electrode 100 of the capacitor 1' may be disposed on the interlayer insulating layer 15, specifically, on the second interlayer insulating layer 15*b*. In addition, when a plurality of capacitors 1' are disposed, bottom surfaces of the plurality of lower electrodes 100 may be separated by an etch stop layer 16. In other words, the etch stop layer 16 may include an opening 16T, and the bottom surface of the lower electrode 100 of the capacitor 1' may be disposed in the opening 16T.

The lower electrode 100 may have a cup shape as shown in FIG. 6. As another example, the lower electrode 100 may have a pillar shape such as a cylinder, a square pillar, or a polygonal pillar extending in a vertical direction (Z direction) as shown in FIG. 7.

In addition, the capacitor 1' may further include a support (not shown) that prevents the lower electrode 100 from tilting or collapse, and the support may be disposed on a sidewall of the lower electrode 100.

The semiconductor apparatuses D10 and D30 may be manufactured by referring to a general method known in the art. For example, the semiconductor apparatuses D10 and D30 may be manufactured through operations i) to xvi) below.

i) forming the device isolation trench 14T in the substrate 11', and forming the device isolation film 14 in the device isolation trench 14T (defining the active region AC of the substrate 102 by the device isolation layer 14 and/or the device isolation trench 14T), ii) filling an inside of the device isolation trench 14T with an insulating material, iii) forming a first source/drain 11'*ab* and a second source/drain 11"*ab* in an upper region of the active region AC by implanting impurity ions into the substrate 11', iv) forming the gate line trench 12T in the substrate 11', v) forming the gate insulating layer 12*a*, the gate electrode 12*b*, and the gate capping layer 12*c* inside the gate line trench 12T, vi) forming a first interlayer insulating layer 15*a* on the substrate 11' and forming an opening (not shown) exposing an upper surface of the first source/drain 11'*ab*, vii) forming the bit line structure 13 electrically connected to the first source/drain 11'*ab* on the opening of vi), viii) forming a second interlayer insulating layer 15*b* covering upper and side surfaces of the bit line structure 13, ix) forming an opening (not shown) in the first and second interlayer insulating layers 15*a* and 15*b* so that upper surfaces of the second source/drain 11"*ab* are exposed, x) forming the contact structure 20' electrically connected to the second source/drain 11"*ab* on the opening of ix), xi) forming the etch stop layer 16 and a mold layer (not shown) on the second interlayer insulating layer 15*b* and the contact structure 20', xii) forming an opening (not shown) in the etch stop layer 16 and the mold layer (not shown) so that an upper surface of the contact structure 20' is exposed, xiii) forming the lower electrode 100 to cover an inner wall of the opening of xii) (to cover bottom and side surfaces), xiv) removing the mold layer (not shown), xv) forming the dielectric layer 300 on the lower electrode 100, and xvi) forming the upper electrode 200 on the dielectric layer 300.

The type and/or order of each operation described above is not limited, may be appropriately changed, and some of the operations may be omitted or some operations may be added. In addition, a deposition process, a patterning process, an etching process, etc. known in the art may be used to form an element in each operation. For example, when an electrode is formed, an etchback process may be applied. In operation v), the gate electrode 12b may be formed by forming a conductive layer on the gate insulating layer 12a and then removing an upper portion of the conductive layer by a predetermined (or otherwise desirable) height through the etchback process. In addition, in xiii), the lower electrode 100 may also be manufactured to have a structure including the plurality of lower electrodes 100 by forming an electrode so as to cover both the upper surface of the mold layer, the bottom surface and the side surface of the opening, and then removing a part of the electrode on the upper surface of the mold layer through the etchback process. As another example, a planarization process may be applied. For example, in operation v), the gate capping layer 12c may be formed by filling the remaining part of the gate line trench 12T with an insulating material, and then planarizing the insulating material so that the upper surface of the substrate 11' is exposed.

Semiconductor devices and semiconductor apparatuses may be applied to various electronic apparatuses. For example, the semiconductor device and/or semiconductor apparatus described above may be applied as a logic device or a memory device in various electronic apparatuses. For example, semiconductor devices and semiconductor apparatuses may be used for arithmetic operations, program execution, temporary data retention, etc. in electronic apparatuses such as mobile devices, computers, notebook computers, sensors, network devices, neuromorphic devices, etc. The semiconductor device and the semiconductor apparatus according to some example embodiments may be useful for electronic apparatuses in which a data transmission amount is large and data transmission is continuously performed.

Figure 8:
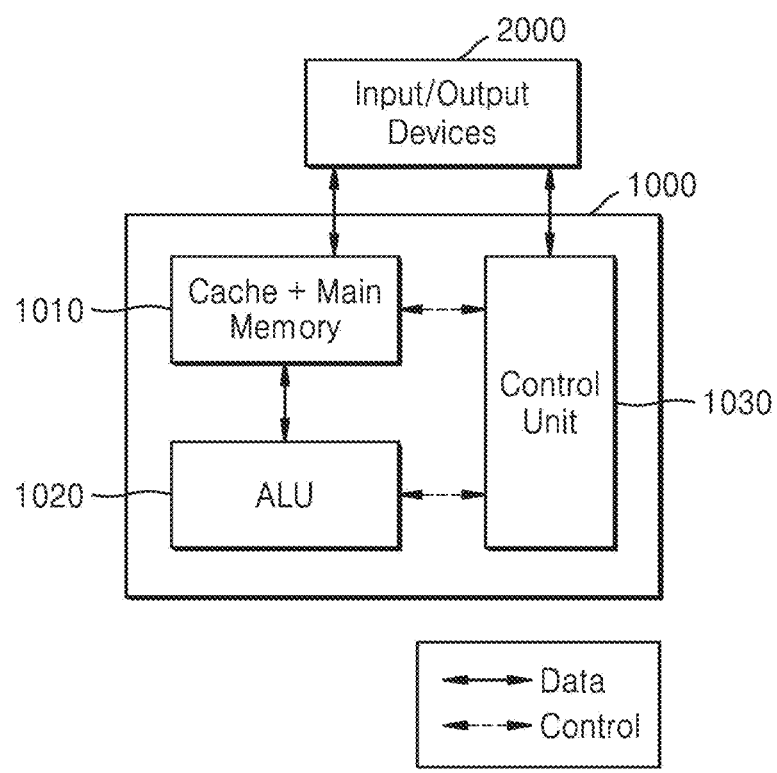
FIGS. 8 and 9 are conceptual diagrams schematically showing a device architecture applicable to an electronic apparatus according to some embodiments.
Figure 9:
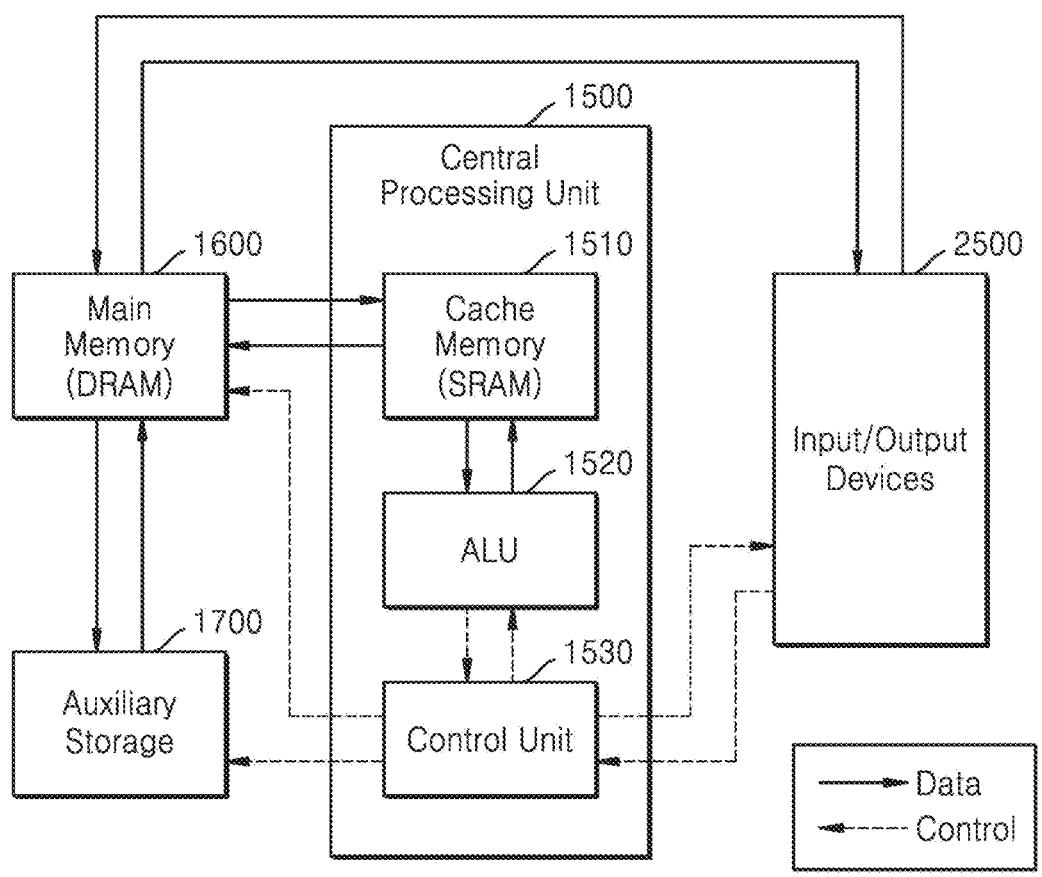

FIGS. 8 and 9 are conceptual diagrams schematically showing an electronic device architecture 1000 applicable to an electronic apparatus according to embodiments.

Figure 10:
FIG. 10 shows a Transmission Electron Microscopy-Energy Dispersive Spectroscopy (TEM-EDS) analysis result of a dielectric layer according to an embodiment.

Referring to FIG. 10, the electronic device architecture 1000 may include a memory unit 1010, an arithmetic logic unit (ALU) 1020, and a control unit 1030. The memory unit 1010, the ALU 1020, and the control unit 1030 may be electrically connected. For example, the electronic device architecture 1000 may be implemented as a single chip including the memory unit 1010, the ALU 1020, and the control unit 1030. In some embodiments, the memory unit 1010, the ALU 1020, and the control unit 1030 may be connected to each other through a metal line in an on-chip to communicate directly. The memory unit 1010, the ALU 1020, and the control unit 1030 may be monolithically integrated on one substrate to form a single chip. The input/output device 2000 may be connected to the electronic device architecture 1000 (chip). Also, the memory unit 1010 may include both a main memory and a cache memory. The electronic device architecture 1000 (chip) may be an on-chip memory processing unit.

The memory unit 1010, the ALU 1020, and/or the control unit 1030 may each independently include the semiconductor device described above. Referring to FIG. 9, a cache memory 1510, an ALU 1520, and a control unit 1530 may form a Central Processing Unit (CPU) 1500, and the cache memory 1510 may include static random access memory (SRAM). Apart from the CPU 1500, a main memory 1600 and an auxiliary storage 1700 may be provided. The main memory 1600 may be dynamic random access memory (DRAM) and may include the semiconductor device described above.

In some cases, the electronic device architecture 1000 may be implemented in a form in which computing unit devices and memory unit devices are adjacent to each other on a single chip, regardless of sub-units.

Hereinafter, the technical content of the semiconductor device will be described in more detail through the following embodiments. However, the following embodiments are for illustrative purposes only and do not limit the scope of the rights.

Embodiment 1

A lower electrode is formed through a DC sputter or an ALD method.

A dielectric layer is formed on the lower electrode through atomic layer deposition (ALD). For example, after forming a first metal oxide layer including zirconium oxide ($ZrO_2$), a second metal oxide layer including zirconium (Zr) and yttrium (Y) is formed on the first metal oxide layer, and a third metal oxide layer including aluminum (Al) is formed on the second metal oxide layer. In addition, when the second metal oxide layer is formed, amounts of a zirconium (Zr) precursor and an yttrium (Y) precursor are adjusted so that ratios of zirconium (Zr), yttrium (Y), and oxygen (O) are 0.09, 0.26, and 0.65, respectively.

An upper electrode is formed on the dielectric layer through a DC sputter or an ALD method.

A capacitor is manufactured by performing rapid thermal annealing (RTA) on the layers and electrodes formed above at a temperature between 400° C. and 1000° C.

Meanwhile, a Transmission Electron Microscopy-Energy Dispersive Spectroscopy (TEM-EDS) analysis result of the formed dielectric layer is shown in FIG. 10. Referring to FIG. 10, it may be seen that yttrium (Y) and aluminum (Al) have a concentration gradient in a thickness direction in the formed dielectric layer, and have a maximum concentration at different positions.

Embodiments 2 to 5

A capacitor is manufactured in the same manner as in Embodiment 1, except that an element ratio in the second metal oxide layer is adjusted by changing the amounts of the zirconium (Zr) precursor and the yttrium (Y) precursor when the second metal oxide layer is formed.

Comparative Example 1

A capacitor is manufactured in the same manner as in Example 1, except, instead of a second metal oxide layer and a third metal oxide layer, a metal oxide layer including zirconium (Zr) and aluminum (Al) is formed on a first metal oxide layer.

Comparative Example 2

A capacitor is manufactured in the same manner as in Example 1, except, instead of a second metal oxide layer and a third metal oxide layer, a metal oxide layer including yttrium (Y) is formed on a first metal oxide layer.

Electrical Property Evaluation 1

The capacitance of each capacitor is listed in Table 1 by applying 1.0 V to the capacitors manufactured by using methods of Embodiment 1 and Comparative Examples 1 to 2 to measure the capacitance, and normalizing the capacitance with respect to the capacitance of the capacitor of Comparative Example 1.

Referring to Table 1, the capacitor of Embodiment 1 including three types of metal elements of zirconium (Zr), aluminum (Al), and yttrium (Y) or three metal oxide layers in the dielectric layer shows high capacitance compared to Comparative Examples 1 and 2 including two types of metal elements or two metal oxide layers.

TABLE 1

|  | Composition | Capacitance |
| --- | --- | --- |
| Embodiment 1 | ZrO/YZrO/AlO | 105% |
| Comparative Example 1 | ZrO/AlZrO | 100% |
| Comparative Example 2 | ZrO/YO | 65% |

Electrical Property Evaluation 2

The capacitance of each capacitor is listed in Table 2 by applying 1.0 V to the capacitors manufactured by using methods of Embodiments 1 to 5 and Comparative Example 1 to measure the capacitance, and normalizing the capacitance with respect to the capacitance of the capacitor of Comparative Example 1.

In addition, a leakage current value is measured by applying 1.0 V to Embodiments 1 to 5 and Comparative Example and listed in Table 2.

Referring to Table 2, the capacitors of Embodiments 1 to 5 including three types of metal elements of zirconium (Zr), aluminum (Al), and yttrium (Y) or three metal oxide layers in the dielectric layer show low leakage current values compared to Comparative Example 1 including two types of metal elements of aluminum (Al) and zirconium (Zr) or two metal oxide layers. In addition, the capacitors of Embodiments 1 to 4, in which the element ratio of yttrium (Y) in the second metal oxide layer is less than or equal to 0.15, show a high capacitance compared to Comparative Example 1.

TABLE 2

|  |  | Element ratio of the second metal oxide layer $Y_xZr_yO_z$ $(x + y + z = 1)$ | | Dielectric layer Elemental ratio | | Capacitance | Leakage current |
| --- | --- | --- | --- | --- | --- | --- | --- |
|  |  | Y (x) | Zr(y) | Y(at %) | Al(at %) | % | (A/cm$^2$) |
| Embodiment 1 | ZrO/YZrO/AlO | 0.09 | 0.26 | 2 | 4 | 105 | $7.7 \times 10^{-7}$ |
| Embodiment 2 | ZrO/YZrO/AlO | 0.032 | 0.31 | 4 | 4 | 106 | $1.2 \times 10^{-6}$ |
| Embodiment 3 | ZrO/YZrO/AlO | 0.063 | 0.28 | 6 | 4 | 106 | $9.7 \times 10^{-7}$ |
| Embodiment 4 | ZrO/YZrO/AlO | 0.12 | 0.24 | 8 | 4 | 101 | $1.4 \times 10^{-6}$ |
| Embodiment 5 | ZrO/YZrO/AlO | 0.16 | 0.2 | 12 | 4 | 82 | $1.3 \times 10^{-6}$ |
| Comparative Example 1 | ZrO/AlZrO | — | — | — | 8 | 100 | $2.6 \times 10^{-6}$ |

Embodiment 6

A capacitor is manufactured in the same manner as in Embodiment 1, except that positions of the aluminum (Al) and yttrium (Y) in the dielectric layer are changed by changing an order of introduction of an aluminum (Al) precursor and an yttrium (Y) precursor. for example, the capacitor including a third metal oxide layer including zirconium (Zr) and aluminum (Al) on the first metal oxide layer, and a second metal oxide layer including yttrium (Y) on the third metal oxide layer is manufactured.

Electrical Property Evaluation 3

The capacitance and a leakage current value are measured when applying 1.0 V to the capacitors of Embodiments 1 and 6, and listed in Table 3. The capacitance is normalized with respect to the capacitance of the capacitor of Embodiment 1.

Referring to Table 3, the capacitors of Embodiments 1 and 6 have similar capacitances, while the capacitor of Embodiment 6 in which yttrium (Y) is disposed adjacent to an upper electrode rather than aluminum (Al) shows a high leakage current value compared to Embodiment 1.

TABLE 3

|  |  | Capacitance | Leakage current value (A/cm$^2$) |
| --- | --- | --- | --- |
| Embodiment 1 | ZrO/YZrO/AlO | 100% | $7.7 \times 10^{-7}$ |
| Embodiment 6 | ZrO/AlZrO/YO | 96% | $4.3 \times 10^{-5}$ |

Embodiments 7 and 8

Capacitors are manufactured in the same manner as in Embodiment 1, except that the second metal oxide layer is adjusted to be positioned at greater than or equal to 40% of a total thickness of the dielectric layer from the lower electrode (Embodiment 7) or the second metal oxide layer is adjusted to be positioned at less than 40% of the total thickness of the dielectric layer from the lower electrode (Embodiment 8), by adjusting thicknesses of the first metal oxide layer, the second metal oxide layer, and the third metal oxide layer. As a result, the dielectric layer of Embodiment 7 has a maximum concentration of yttrium (Y) at a position greater than or equal to 40% of the thickness of the dielectric layer away from the lower electrode, and the dielectric layer of Embodiment 8 has a maximum concentration of yttrium (Y) at a position less than 40% of the thickness of the dielectric layer away from the lower electrode Electrical Property Evaluation 4

The capacitance and a leakage current value are measured when applying 1.0 V to the capacitors of Embodiments 7 and 8, and listed in Table 4. The capacitance is normalized with respect to the capacitance of the capacitor of Embodiment 7.

Referring to Table 4, the capacitor of Embodiment 7 in which the second metal oxide layer is disposed at a position greater than or equal to 40% of the total thickness of the dielectric layer from the lower electrode shows a high capacitance and a low leakage current value compared to Embodiment 8.

TABLE 4

| | Position of second metal oxide layer | Capacitance | Leakage current value (A/cm$^2$) |
|---|---|---|---|
| Embodiment 7 | Greater than or equal to 40% of the total thickness of the dielectric layer | 100% | $7.7 \times 10^{-7}$ |
| Embodiment 8 | Less than 40% of the total thickness of the dielectric layer | 76% | $2.7 \times 10^{-5}$ |

Although the embodiments have been described in detail above, the scope of the rights is not limited thereto, and various modifications and improvements of those skilled in the art using the basic concepts defined in the following claims also belong to the scope of the rights.

A semiconductor device having a high capacitance and excellent leakage current blocking/reduction characteristics and a semiconductor apparatus including the same may be provided. The semiconductor device may implement an improved integration and contribute to miniaturization of an electronic apparatus.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An electronic device comprising:
   a lower electrode;
   an upper electrode spaced apart from the lower electrode; and
   a dielectric layer between the lower electrode and the upper electrode, the dielectric layer comprising
       a first metal oxide region comprising a first metal oxide of one or more of Hf, Zr, Nb, Ta, Pr, Nd, Gd, Dy, Yb, Pb, Zn, Si, Ti, Sr, or Lu,
       a second metal oxide region comprising a second metal oxide, the second metal oxide comprising one or more of Y, Sc, or Ce and further comprising one or more of Hf, Zr, Nb, Ta, Pr, Nd, Gd, Dy, Yb, Pb, Zn, Si, Ti, Sr, or Lu, and
       a third metal oxide region comprising a third metal oxide of one or more of Al, Mg, or Be,
   wherein a thickness of the second metal oxide is less than a thickness of the first metal oxide.

2. The electronic device of claim 1, wherein
   the first metal oxide region includes a first metal oxide layer,
   the second metal oxide region includes a second metal oxide layer,
   the third metal oxide region includes a third metal oxide layer,
   the first metal oxide layer, the second metal oxide layer, and the third metal oxide layer are, sequentially, in a stack between the lower electrode and the upper electrode in a thickness direction.

3. The electronic device of claim 1, wherein
   the second metal oxide region comprises a compound expressed as $A_xB_yO_z$,
   where A is the one or more of Y, Sc, or Ce,
   B is the one or more of Hf, Zr, Nb, Ta, Pr, Nd, Gd, Dy, Yb, Pb, Zn, Si, Ti, Sr, or Lu,
   O is oxygen, and
   $x+y+z=1$.

4. The electronic device of claim 3, wherein, in the second metal oxide region, a ratio of the A to the B is greater than or equal to 0.01 and less than or equal to 1.0.

5. The electronic device of claim 3, wherein the x is greater than 0.0 and less than or equal to 0.2.

6. The electronic device of claim 3, wherein the x is greater than 0.0 and less than or equal to 0.15.

7. The electronic device of claim 3, wherein the y is greater than 0.0 and less than or equal to 0.5.

8. The electronic device of claim 3, wherein the y is greater than or equal to 0.2 and less than or equal to 0.5.

9. The electronic device of claim 1, wherein
   the first metal oxide region is adjacent to the lower electrode, and
   the thickness of the first metal oxide region is greater than or equal to 40% of a total thickness of the dielectric layer.

10. The electronic device of claim 1, wherein the thickness of the second metal oxide region is greater than or equal to 5 Å and less than or equal to 50 Å.

11. The electronic device of claim 1, wherein a thickness of the dielectric layer is greater than or equal to 20 Å and less than or equal to 100 Å.

12. The electronic device of claim 1, wherein at least one of the lower electrode or the upper electrode comprise a metal, a metal nitride, a metal oxide, or a combination thereof.

13. The electronic device of claim 1, wherein
   at least one of the lower electrode or the upper electrode comprise a metal nitride expressed as MM'N,
   where M is one or more of Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, or U,
   M' is different from M and is one or more of H, Li, As, Se, N, O, P, S, Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, or U, and
   N is nitrogen.

14. An electronic device comprising:
   a lower electrode;
   an upper electrode spaced apart from the lower electrode; and
   a dielectric layer between the lower electrode and the upper electrode, the dielectric layer comprising
       an internal position between an upper oxide region and a lower oxide region of the dielectric layer, the internal position comprising a metal oxide compound expressed as $A_xB_yO_z$, where A is one or more of Y, Sc, and Ce, B is one or more of Hf, Zr, Nb, Ta, Pr, Nd, Gd, Dy, Yb, Pb, Zn, Si, Ti, Sr, or Lu, $x+y+z=1$, O is oxygen, and $0<x\leq0.2$, $0<y\leq0.5$, and a thickness of the lower oxide region is greater than or equal to 40% of a thickness of the dielectric layer, wherein a concentration of A in the upper and lower oxide regions is less than x, and
the thickness of the lower oxide region is greater than a thickness of the upper oxide region.

15. The electronic device of claim 14, wherein the thickness of the dielectric layer is greater than or equal to 10 Å and less than or equal to 50 Å.

16. The electronic device of claim 14, wherein the x is greater than 0.0 and less than or equal to 0.15.

17. The electronic device of claim 14, wherein the y is greater than or equal to 0.2 and less than or equal to 0.5.

18. An electronic device comprising:
a lower electrode;
an upper electrode spaced apart from the lower electrode; and
a dielectric layer between the lower electrode and the upper electrode, the dielectric layer an oxide comprising one or more first elements selected from Hf, Zr, Nb, Ta, Pr, Nd, Gd, Dy, Yb, Pb, Zn, Si, Ti, or Lu, one or more second elements selected from Y, Sc, or Ce, and one or more third elements selected from Al, Mg, or Be,
wherein the one or more second elements and the one or more third elements have a concentration gradient in a thickness direction of the dielectric layer, and each has a maximum concentration at different positions in the dielectric layer, and
wherein the dielectric layer includes an internal region between an upper oxide region and an oxide lower region, and the internal region includes the one or more second elements and at least one of the one or more first elements or the one or more third elements, and
the maximum concentration of the one or more second elements is in the internal region, and
wherein a thickness the internal region is less than a thickness of the lower oxide region.

19. The electronic device of claim 18, wherein the maximum concentration of the one or more second elements is at a position greater than or equal to 40% and less than or equal to 90% of a thickness of the dielectric layer away from the lower electrode.

20. The electronic device of claim 18, wherein a ratio of a content of the one or more second elements to a total content of metal elements in the dielectric layer is greater than 0.0 at % and less than or equal to 5.0 at %.

21. The electronic device of claim 18, wherein the maximum concentration of the one or more third elements is at a position greater than 0% and less than or equal to 20% of a thickness of the dielectric layer away from the upper electrode.

22. The electronic device of claim 18, wherein a ratio of a content of the one or more third elements to a total content of metal elements in the dielectric layer is greater than 0.0 at % and less than or equal to 5.0 at %.

23. The electronic device of claim 18, wherein a ratio of a content of the one or more second elements to a content of the one or more third elements in the dielectric layer is greater than or equal to 10% and less than or equal to 200%.

24. A semiconductor apparatus comprising:
a field effect transistor; and
the electronic device of claim 1 electrically connected to the field effect transistor.

25. The semiconductor apparatus of claim 24, wherein the field effect transistor comprises:
a semiconductor layer comprising a source region and a drain region;
a gate insulating layer on the semiconductor layer; and
a gate electrode on the gate insulating layer.

26. The electronic device of claim 14, wherein the upper oxide region and the lower oxide region are contiguous such that both the upper region and the lower region include the metal oxide compound expressed as $A_xB_yO_z$.

* * * * *